United States Patent
Hirai et al.

(10) Patent No.: US 10,718,554 B2
(45) Date of Patent: Jul. 21, 2020

(54) MANIFOLD AND INFORMATION PROCESSING APPARATUS

(71) Applicant: FUJITSU LIMITED, Kawasaki-shi, Kanagawa (JP)

(72) Inventors: Keita Hirai, Kawasaki (JP); Tsuyoshi So, Kawasaki (JP); Naofumi Kosugi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 296 days.

(21) Appl. No.: 15/792,827

(22) Filed: Oct. 25, 2017

(65) Prior Publication Data

US 2018/0135901 A1 May 17, 2018

(30) Foreign Application Priority Data

Nov. 11, 2016 (JP) ................................ 2016-220867

(51) Int. Cl.
*F25B 39/02* (2006.01)
*F28F 9/02* (2006.01)
*H05K 7/20* (2006.01)
*F28D 1/053* (2006.01)

(52) U.S. Cl.
CPC ........ *F25B 39/028* (2013.01); *F28D 1/05391* (2013.01); *F28F 9/0265* (2013.01); *F28F 9/0273* (2013.01); *F28F 9/0278* (2013.01); *H05K 7/20272* (2013.01); *H05K 7/20781* (2013.01); *F25B 2339/044* (2013.01)

(58) Field of Classification Search
CPC ..... F25B 39/028; F28F 9/0273; F28F 9/0278; F28F 9/0265; H05K 7/20272; H05K 7/20781; F28D 1/05391
See application file for complete search history.

(56) References Cited

U.S. PATENT DOCUMENTS

| | | | | |
|---|---|---|---|---|
| 5,508,197 A * | 4/1996 | Hansen | ............. | B01L 7/52 422/109 |
| 6,031,751 A * | 2/2000 | Janko | ............. | F28F 13/00 165/104.33 |
| 9,980,415 B2 * | 5/2018 | Zhou | ............. | H05K 7/20927 |
| 2005/0081534 A1 * | 4/2005 | Suzuki | ............. | F28D 1/05366 62/50.2 |
| 2008/0141706 A1 * | 6/2008 | Tucker | ............. | F25B 39/028 62/498 |
| 2010/0206535 A1 * | 8/2010 | Munoz | ............. | F28F 9/0273 165/173 |
| 2011/0113823 A1 * | 5/2011 | Joboji | ............. | F25B 39/022 62/515 |

(Continued)

FOREIGN PATENT DOCUMENTS

| | | |
|---|---|---|
| EP | 2778595 | 9/2014 |
| JP | 2012-002475 | 1/2012 |
| WO | 2013/076993 | 5/2013 |

*Primary Examiner* — Kun Kai Ma
(74) *Attorney, Agent, or Firm* — Fujitsu Patent Center

(57) ABSTRACT

A manifold includes: a branch pipe including an inflow port and a plurality of outflow ports; and a partition wall that partitions an inside of the branch pipe into a side of the inflow port and a side of the plurality of outflow ports and includes: a plurality of through-holes that have a total opening area greater than an opening area of the inflow port; and a plurality of first facing portions that face the respective outflow ports.

16 Claims, 11 Drawing Sheets

(56) References Cited

U.S. PATENT DOCUMENTS

| | | | |
|---|---|---|---|
| 2014/0071623 A1* | 3/2014 | Suzuki | H05K 7/20636 361/699 |
| 2014/0123696 A1* | 5/2014 | Kim | F28F 9/0265 62/498 |
| 2015/0083377 A1* | 3/2015 | Jindou | F25B 39/022 165/143 |
| 2015/0250075 A1* | 9/2015 | Hirai | H01L 23/473 165/56 |
| 2016/0040942 A1* | 2/2016 | Dziubinschi | F28F 9/005 165/135 |
| 2016/0205809 A1* | 7/2016 | Aoki | H05K 7/20772 361/699 |
| 2017/0181317 A1* | 6/2017 | Wan | F28F 3/12 |
| 2018/0132387 A1* | 5/2018 | So | H05K 7/20772 |
| 2018/0135901 A1* | 5/2018 | Hirai | F28F 9/0265 |
| 2018/0153058 A1* | 5/2018 | Hirai | H05K 7/20781 |
| 2018/0177079 A1* | 6/2018 | Nakagawa | H05K 7/20781 |
| 2018/0368281 A1* | 12/2018 | Wang | H05K 7/20781 |
| 2019/0104646 A1* | 4/2019 | So | H05K 7/20272 |
| 2019/0132991 A1* | 5/2019 | Gardoni | H05K 7/20218 |

\* cited by examiner

MANIFOLD AND INFORMATION PROCESSING APPARATUS

CROSS-REFERENCE TO RELATED APPLICATION

This application is based upon and claims the benefit of priority of the prior Japanese Patent Application No. 2016-220867, filed on Nov. 11, 2016, the entire contents of which are incorporated herein by reference.

FIELD

The embodiments discussed herein are related to a manifold and an information processing apparatus.

An information processing apparatus includes a heat exchanger, a refrigerant distributor, and so forth.

BACKGROUND

There is a heat exchanger in which an inside of a first header collecting pipe to which a plurality of flat pipes are connected is partitioned into a communication chamber and a mixing chamber by a vertical partition wall, and the communication chamber is partitioned by a horizontal partition plate.

In addition, there is a refrigerant distributor in which a cylindrical metal net or foam metal is inserted between an outer pipe, to which a plurality of branch pipes for flowing a refrigerant are connected, and an internal pipe, which is accommodated in the outer pipe and has a plurality of refrigerant outflow holes.

Related technique is disclosed in International Publication Pamphlet No. WO 2013/076993 or Japanese Laid-open Patent Publication No. 2012-2475.

SUMMARY

According to an aspect of the embodiments, a manifold includes: a branch pipe including an inflow port and a plurality of outflow ports; and a partition wall that partitions an inside of the branch pipe into a side of the inflow port and a side of the plurality of outflow ports and includes: a plurality of through-holes that have a total opening area greater than an opening area of the inflow port; and a plurality of first facing portions that face the respective outflow ports.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

For example, in a heat exchanger, an inside of a first header collecting pipe to which a plurality of flat pipes are connected is partitioned into a communication chamber and a mixing chamber by a vertical partition wall, and the communication chamber is partitioned by a horizontal partition plate.

For example, in a refrigerant distributor, a cylindrical metal net or foam metal is inserted between an outer pipe, to which a plurality of branch pipes for flowing a refrigerant are connected, and an internal pipe, which is accommodated in the outer pipe and has a plurality of refrigerant outflow holes.

In a manifold in which a fluid is divided and flows out from a plurality of outflow ports, a flow rate of the fluid at the outflow ports may be uniform. For example, in a case where the flow rate of the fluid is uniform at the outflow ports by increasing a volume of branch pipes, the manifold may become large.

For example, in a small manifold, the flow rate of a fluid at outflow ports may be uniform.

In the following drawings, a vertically downward direction is indicated by an arrow G.

Figure 1:
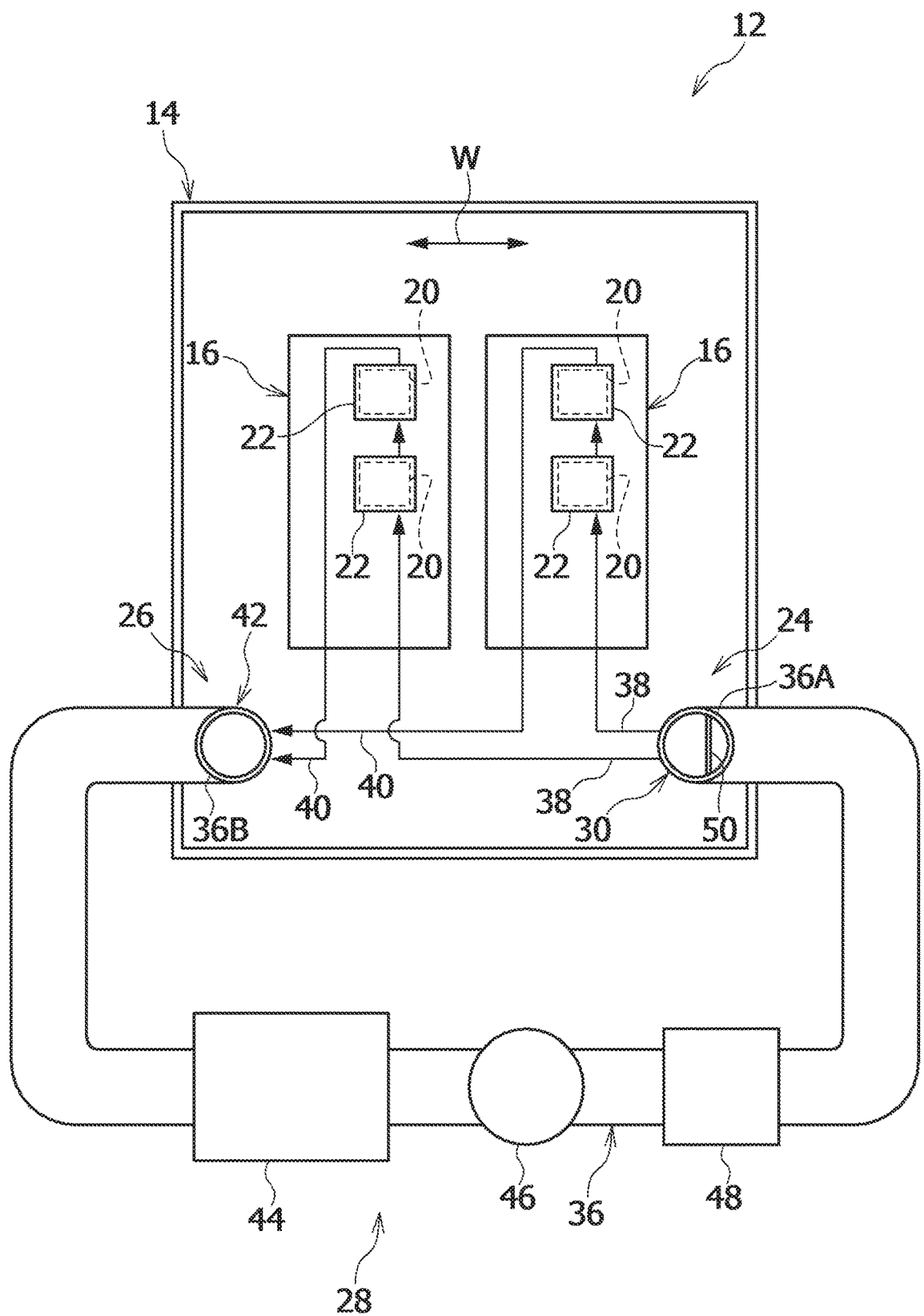
FIG. 1 is an exemplary plan view illustrating an information processing apparatus.
Figure 2:
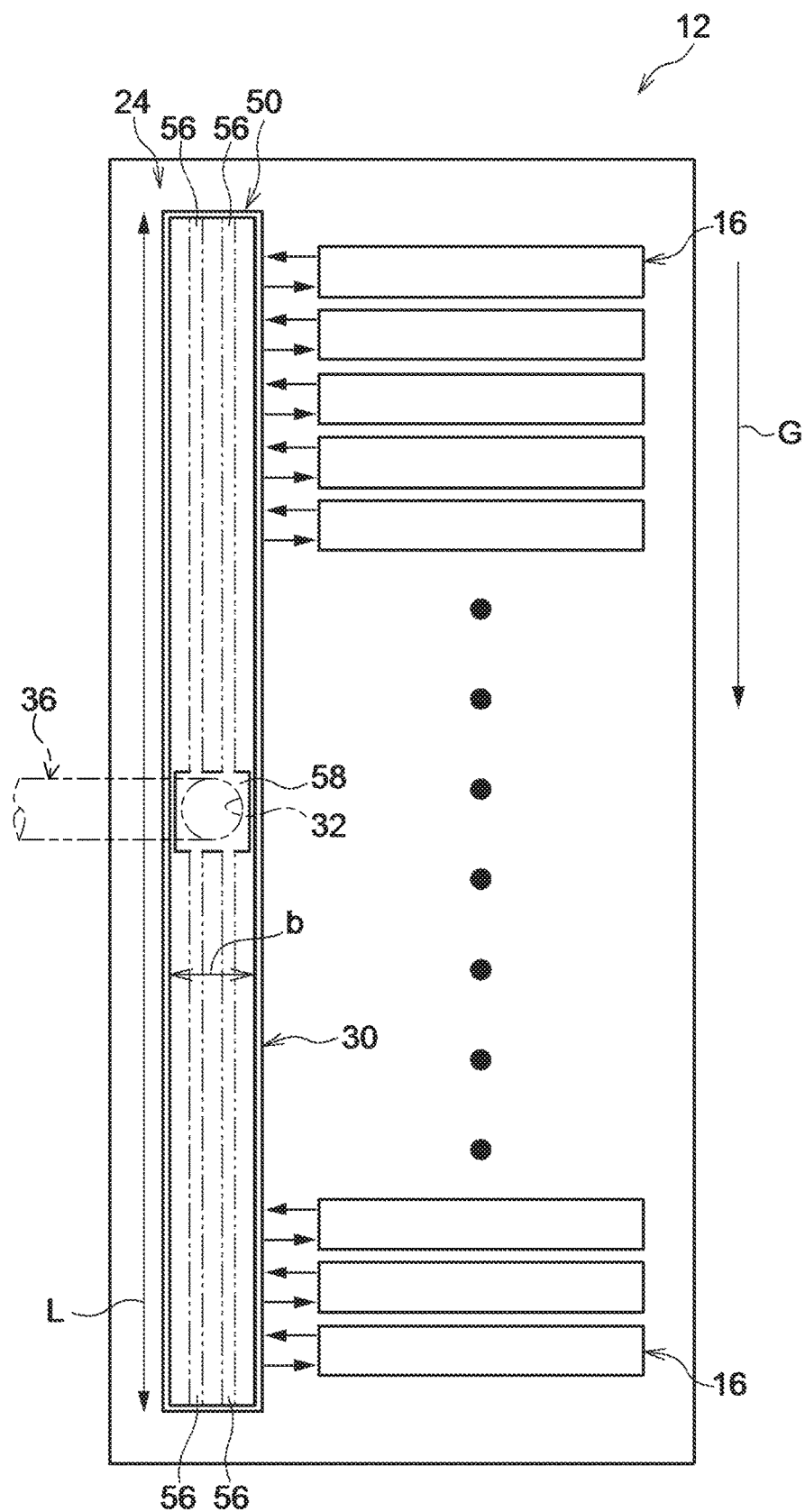
FIG. 2 is an exemplary side view illustrating the information processing apparatus.

As illustrated in FIGS. 1 and 2, an information processing apparatus 12 has a rack 14. A plurality of server units 16 are accommodated in the rack 14 and the information processing apparatus 12 is a server apparatus. The information processing apparatus 12 is not limited to the server apparatus and may be, for example, a super computer or the like. For example, the server units 16 are horizontally placed and the plurality of server units 16 are arranged in a superimposed manner in a vertical direction. The server units 16 are also arranged side by side in a plurality of rows in a width direction (arrow W direction) of the rack 14. In FIGS. 1 and 2, since 36 server units 16 per row are arranged one behind the other in the vertical direction and the server units 16 are arranged in two rows in the width direction of the rack 14, a total of 72 server units 16 are accommodated in the rack 14.

Each of the server units 16 has a substrate 18 and one or a plurality of electronic components 20 mounted on the substrate 18. The electronic component 20 may be, for example, an integrated circuit such as a processor. Since the information processing apparatus 12 is provided with the plurality of server units 16, for example, the substrates 18 and one or the plurality of electronic components 20 are mounted on each of the substrates 18, a plurality of electronic components 20 are also present. A heat transfer member 22 that transmits heat of the electronic component 20 to a cooling liquid is disposed at each of the plurality of electronic components 20.

The information processing apparatus 12 has a liquid flow dividing member 24, a liquid joining member 26, and a liquid circulation member 28. The liquid flow dividing member 24 may be an example of the manifold.

Figure 3:
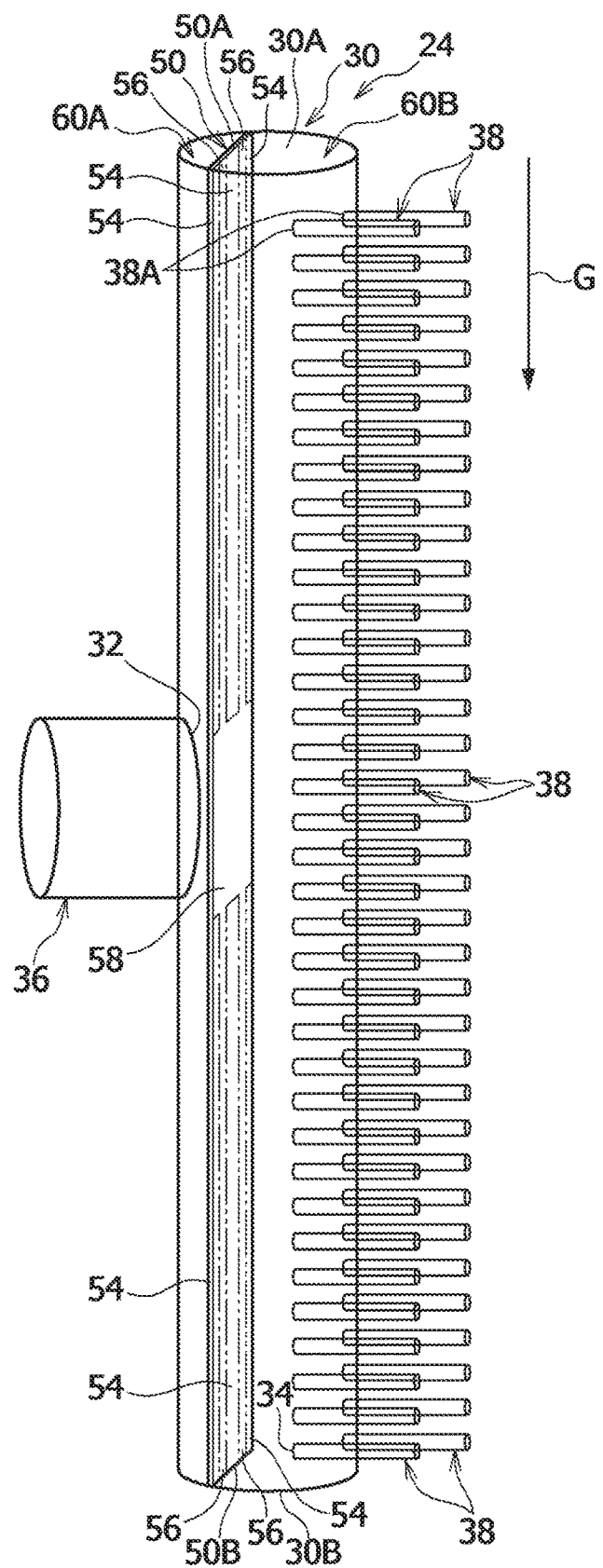
FIG. 3 is an exemplary perspective view illustrating a manifold.
Figure 4:
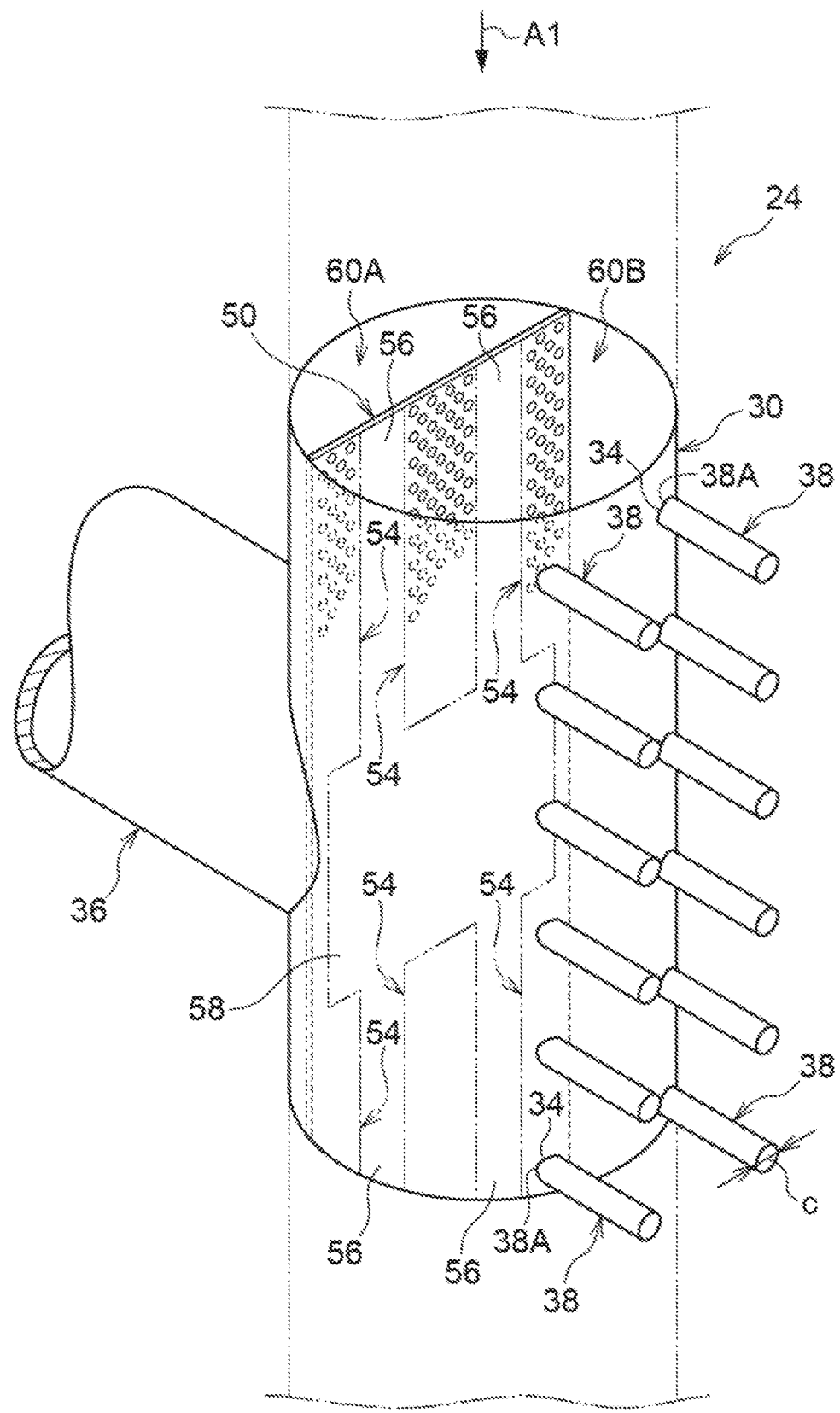
FIG. 4 is an example of a partially enlarged perspective view illustrating the manifold.
Figure 5:
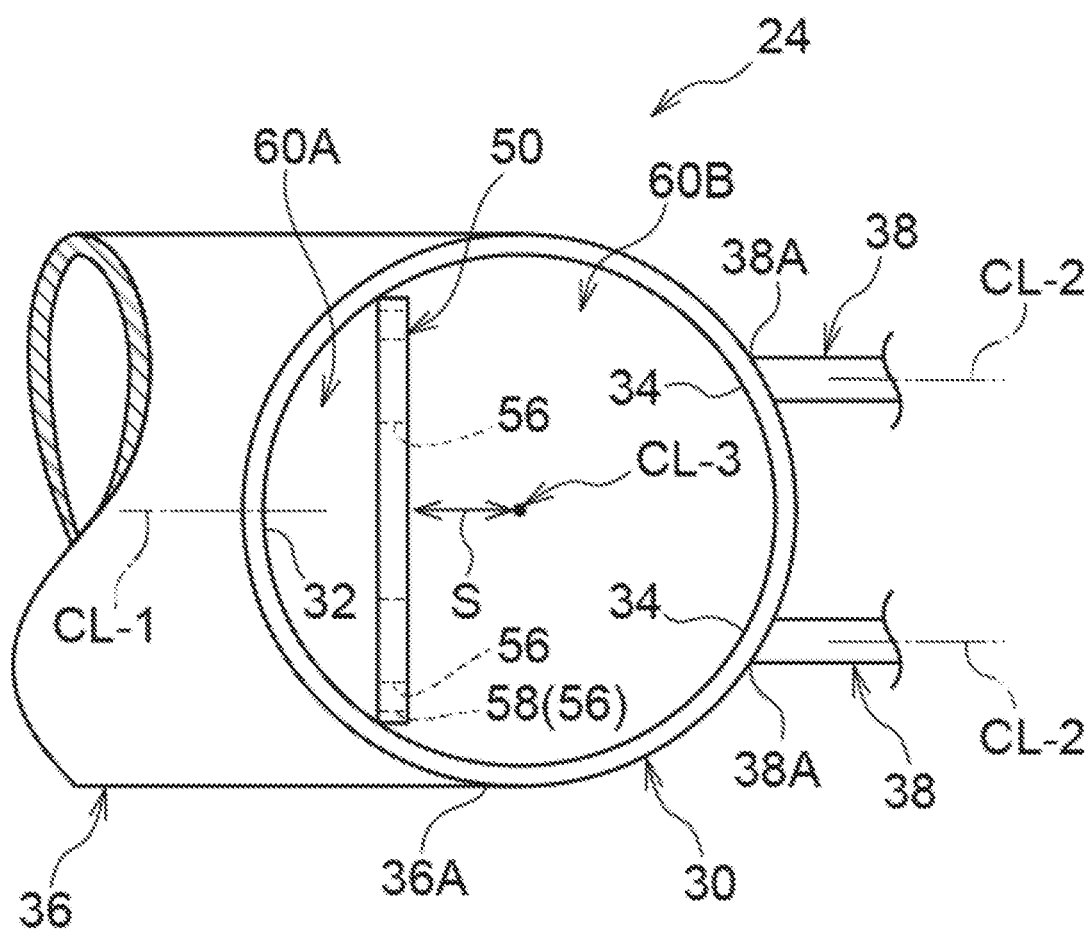
FIG. 5 is an exemplary plan view illustrating the manifold.

As illustrated in FIGS. 3 to 5, the liquid flow dividing member 24 has a distribution pipe 30. The distribution pipe 30 may be an example of the branch pipe. For example, the distribution pipe 30 has a cylindrical shape having a length (inner dimension) L and an inner diameter b, both ends of which in an axial direction are respectively closed by an upper base 30A and a lower base 30B.

Figure 6:
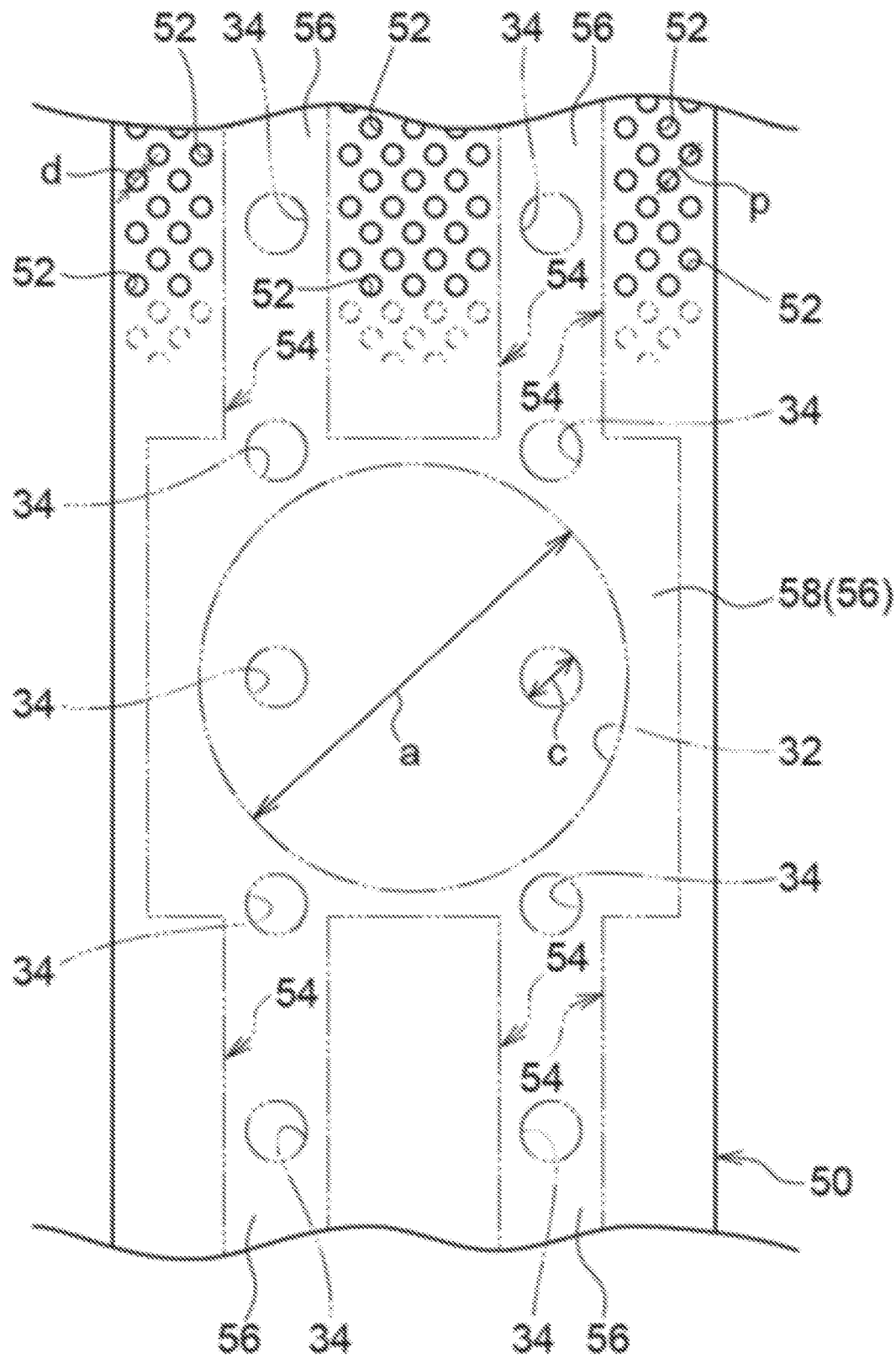
FIG. 6 is an exemplary front view of a partition wall, an inflow port, and outflow ports.

An outer peripheral surface of the distribution pipe 30 is provided with an inflow port 32 having an inner diameter a (see FIG. 6). One inflow port 32 is provided with one distribution pipe 30. In FIG. 2, although the inflow port 32 is formed at a center of the distribution pipe 30 in the axial direction, the inflow port 32 may be formed at a position close to the upper base 30A or the lower base 30B.

A plurality of outflow ports 34 having an inner diameter c (see FIG. 6) are further formed on the outer peripheral surface of the distribution pipe 30. For example, the number n of the outflow ports 34 may be the same as the number of the server units 16.

In FIGS. 3 to 5, the plurality of outflow ports 34, for example, 36 outflow ports 34 are formed one behind the other in rows at regular intervals in the axial direction of the distribution pipe 30, and a plurality of rows, for example, two rows of the outflow ports 34 are also formed in a circumferential direction of the distribution pipe 30. For example, the plurality of outflow ports 34 may be a circular shape having the same opening area.

As illustrated in FIG. 5, each of the plurality of outflow ports 34 is disposed at a position facing the inflow port 32 when viewed in the axial direction (longitudinal direction) of the distribution pipe 30. A center line CL-1 of the inflow port 32 and a center line CL-2 of each of the outflow ports 34 may be parallel.

The inflow port 32 is connected to one end 36A of a circulation pipe 36. The outflow port 34 is connected to one end 38A of each of a plurality of supply pipes 38 corresponding to the outflow ports 34 respectively one by one. As illustrated in FIG. 1, the cooling liquid which is supplied from the supply pipe 38 to the heat transfer member 22 and receives heat of the electronic component 20 is discharged from a discharge pipe 40 to a joining pipe 42. The cooling liquid sent from a plurality of discharge pipes 40 joins in the joining pipe 42. A thickness of the distribution pipe 30 may be the same thickness as that of the circulation pipe 36, or may be different from that of the circulation pipe 36 due to the ease connection with the one end 36A of the circulation pipe 36 or manufacturability.

The other end 36B of the circulation pipe 36 is connected to the joining pipe 42. The circulation pipe 36 is provided with a tank 44, a pump 46, and a heat radiation member 48. The tank 44 stores the cooling liquid and the cooling liquid flows toward the liquid flow dividing member 24 using the pump 46. The heat radiation member 48 radiates heat of the cooling liquid flowing through the circulation pipe 36 to an outside and cools the cooling liquid. In the circulation pipe 36, the positions of the tank 44, the pump 46, and the heat radiation member 48 are not limited to the positions illustrated in FIG. 1 and the heat radiation member 48 may be positioned, for example, on an upstream side of the tank 44 in a circulation direction of the cooling liquid.

As illustrated in FIGS. 4 to 6, a partition plate 50 is disposed inside the distribution pipe 30. The partition plate 50 partitions an inside of the distribution pipe 30 into a first region 60A of the inflow port 32 and a second region 60B on an outflow port 34 side when viewing the distribution pipe 30 in the axial direction. The partition plate 50 is an example of the partition wall. In FIGS. 4 to 6, the partition plate 50 has a flat plate shape, but may have, for example, a shape of which a part or an entirety is curved or a center is bent when viewed in the axial direction of the distribution pipe 30.

As illustrated in FIG. 5, a center line CL-3 of the distribution pipe 30 is at an intermediate position between the inflow port 32 and the outflow port 34 when viewed in the axial direction of the distribution pipe 30. The partition plate 50 is disposed at a position of the center line CL-3 of the distribution pipe 30 or a position close to the inflow port 32. An amount displaced toward the inflow port 32 side from the center line CL-3 may be an offset amount S. If the partition plate 50 is offset to a position close to the inflow port 32, a volume of the second region 60B is greater than a volume of the first region 60A inside the distribution pipe 30.

As illustrated in FIG. 6, the partition plate 50 is formed with a plurality of through-holes 52 each having an inner diameter d. For example, the plurality of through-holes 52 may be circular and an opening area of each of the through-holes 52 is smaller than an opening area of the outflow port 34. A total opening area (sum of opening areas) of the plurality of through-holes 52 is greater than an opening area of the inflow port 32. The through-holes 52 are formed at positions where the adjacent through-holes 52 are shifted by a predetermined pitch p, and are arranged in a zigzag manner.

The partition plate 50 is formed with a facing portion 56 and a second facing portion 58. The facing portion 56 and the second facing portion 58 may be portions at which the through-holes 52 are not formed in the partition plate 50. The facing portion 56 includes a plurality of facing portions 56 and faces the outflow port 34 on a line of the center line CL-2 of each of the outflow ports 34. In FIG. 6, the plurality of facing portions 56 facing each of the outflow ports 34 are connected in a height direction of the partition plate 50. The second facing portion 58 faces the inflow port 32 on a line of the center line CL-1 of the inflow port 32.

As illustrated in FIG. 5, the partition plate 50 perpendicularly intersects the center line CL-1 of the inflow port 32 and the center line CL-2 of the outflow port 34. Therefore, the facing portion 56 perpendicularly intersects the center line CL-2 of the outflow port 34 and the second facing portion 58 perpendicularly intersects the center line CL-1 of the inflow port 32. A part of the outflow ports 34 overlaps the inflow port 32 when viewed in the direction of the center line CL-2 and in the overlapped portion, the second facing portion 58 also serves as the facing portion 56.

As illustrated in FIGS. 4 and 6, in the partition plate 50, a portion, in which the facing portion 56 or the second facing portion 58 is not formed, may be a portion in which the through-holes 52 are formed. In FIGS. 2 and 4, the through-holes 52 are omitted, and in FIG. 6, a part of the through-holes 52 is also omitted, and the portion in which the through-holes 52 are formed is illustrated as a through-hole forming portion 54.

One end 50A and the other end 50B of the partition plate 50 in the longitudinal direction are respectively in contact with the upper base 30A of one end and the lower base 30B of the other end of the distribution pipe 30 in the axial direction. For example, the partition plate 50 has a shape continuing from the upper base 30A of the one end to the lower base 30B of the other end of the distribution pipe 30.

In the information processing apparatus 12 described above, the cooling liquid flows from the circulation pipe 36 of the liquid circulation member 28 to the liquid flow dividing member 24 by driving the pump 46. The cooling liquid is divided in the liquid flow dividing member 24 and the cooling liquid flows from the supply pipe 38 to the heat transfer member 22. The heat transfer member 22 receives heat of the electronic component 20 and the electronic component 20 is cooled. The cooling liquid flows from the heat transfer member 22 to the liquid joining member 26 and joins, and returns to the circulation pipe 36.

The partition plate 50 is provided in the distribution pipe 30 of the liquid flow dividing member 24. The flow of the cooling liquid flowing into the distribution pipe 30 from the inflow port 32 is temporarily blocked by the partition plate 50 and a direction of the flow of the cooling liquid is converted into a direction along the partition plate 50. The cooling liquid flowing into the distribution pipe 30 from the inflow port 32 moves from the first region 60A to the second region 60B via the through-holes 52. The through-hole 52 may be a portion which does not face the outflow port 34. The facing portion 56 of the partition plate 50 faces each of the outflow ports 34 and the cooling liquid passing through the through-holes 52 may be reduced to directly flow into the outflow port 34. For example, pressure loss in the flow of the cooling liquid is uniform from the inflow port 32 to each of the outflow ports 34. Therefore, it may be reduced that the cooling liquid flows out from each of the outflow ports 34 at a nonuniform flow rate. A total opening area of the through-holes 52 is greater than an opening area of the inflow port 32. Therefore, the pressure loss from the inflow port 32 to the outflow port 34 within the distribution pipe 30 is smaller than that in a structure in which the total opening area of the through-holes 52 is smaller than the opening area of the inflow port 32. For example, since the flow rate of the cooling liquid for cooling the electronic component 20 is secured without increasing the diameter of the distribution pipe 30, the liquid flow dividing member 24 is reduced in size. Since the pump 46 is not increased in size (high output) in order to secure the flow rate of the cooling liquid, the information processing apparatus 12 may be reduced in size and power consumption may be reduced.

An opening area of each of the plurality of through-holes 52 is smaller than an opening area of each of the plurality of outflow ports 34. Therefore, the flow of the cooling liquid passing through each of the through-holes 52 may be attenuated compared to a structure in which the opening area of each of the through-holes 52 is greater than the opening area of the outflow port 34.

Since a large number of the through-holes 52 each of which the opening area is small are formed in the partition plate 50, the cooling liquid is dispersed and flows through the large number of the through-holes 52. Therefore, since the pressure loss between the inflow port 32 and each of the outflow ports 34 is balanced, the pressure of the cooling liquid may be made uniform at the plurality of outflow ports 34.

Each of the facing portions 56 perpendicularly intersects the center line CL-2 of the outflow port 34. Therefore, the flow rate for each of the outflow ports 34 may be effectively uniform compared to a structure in which the facing portion 56 is inclined with respect to the center line CL-2 of the outflow port 34.

The partition plate 50 has the second facing portion 58. Since the second facing portion 58 faces the inflow port 32, the cooling liquid flowing into the distribution pipe 30 from the inflow port 32 strikes against the second facing portion 58 and the flow direction of the cooling liquid may be effectively changed in a direction different from the center line CL-1 of the inflow port 32.

The second facing portion 58 perpendicularly intersects the center line CL-1 of the inflow port 32. Therefore, the direction of the cooling liquid flowing into the distribution pipe 30 from the inflow port 32 may be effectively changed compared to a structure in which the second facing portion 58 is inclined with respect to the center line CL-1 of the inflow port 32.

The partition plate 50 is disposed at the position of the center line CL-3 of the distribution pipe 30 or at a position close to the inflow port 32 in the distribution pipe 30. Since the cooling liquid flowing into the distribution pipe 30 from the inflow port 32 directly strikes against the partition plate 50, for example, the second facing portion 58, the direction of the cooling liquid may be effectively changed compared to a structure in which the partition plate 50 is disposed at a position closer to the outflow port 34 than the center line CL-3 of the distribution pipe 30.

The partition plate 50 is disposed at a position closer to the inflow port 32 than the center line CL-3 of the distribution pipe 30 and the volume of the second region 60B on the outflow port 34 side is greater than the volume of the first region 60A on the inflow port 32 side. Therefore, in the second region 60B, since the resistance is small when the cooling liquid moves in the axial direction of the distribution pipe 30, the cooling liquid may easily spread to the plurality of outflow ports 34.

The partition plate 50 is disposed at a position closer to the inflow port 32 than ⅓ of the inner diameter a when viewing the distribution pipe 30 in the axial direction, and a flow speed of the cooling liquid flowing into the distribution pipe 30 from the inflow port 32 may be effectively reduced.

For example, the distribution pipe 30 may be a cylindrical member. The distribution pipe 30 is not limited to the cylindrical shape and may be, for example, a prismatic shape. In the cylindrical distribution pipe 30, a shape viewed in the axial direction (longitudinal direction) is circular, an internal water pressure acts evenly on the surroundings, and durability may be high.

The inflow port 32 and the outflow port 34 are disposed on the outer peripheral surface of the distribution pipe 30. Since the circulation pipe 36 or the supply pipe 38 does not protrude in the axial direction of the distribution pipe 30, a length of the liquid flow dividing member 24 may be shortened compared to a structure in which the inflow port 32 or the outflow port 34 is disposed at the upper base 30A and the lower base 30B of the distribution pipe 30. Since the circulation pipe 36 or the supply pipe 38 is not present at the upper base 30A and the lower base 30B, a plurality of distribution pipes 30 may be easily connected in the axial direction.

Since the inflow port 32 and the outflow port 34 are disposed on the outer peripheral surface of one distribution pipe 30, the structure is simplified and lightened because, a plurality of pipes, such as a pipe in which the inflow port 32 is disposed, for example, an outer cylinder, and a pipe in which the outflow port 34 is disposed, for example, an inner cylinder are not provided.

Figure 7:
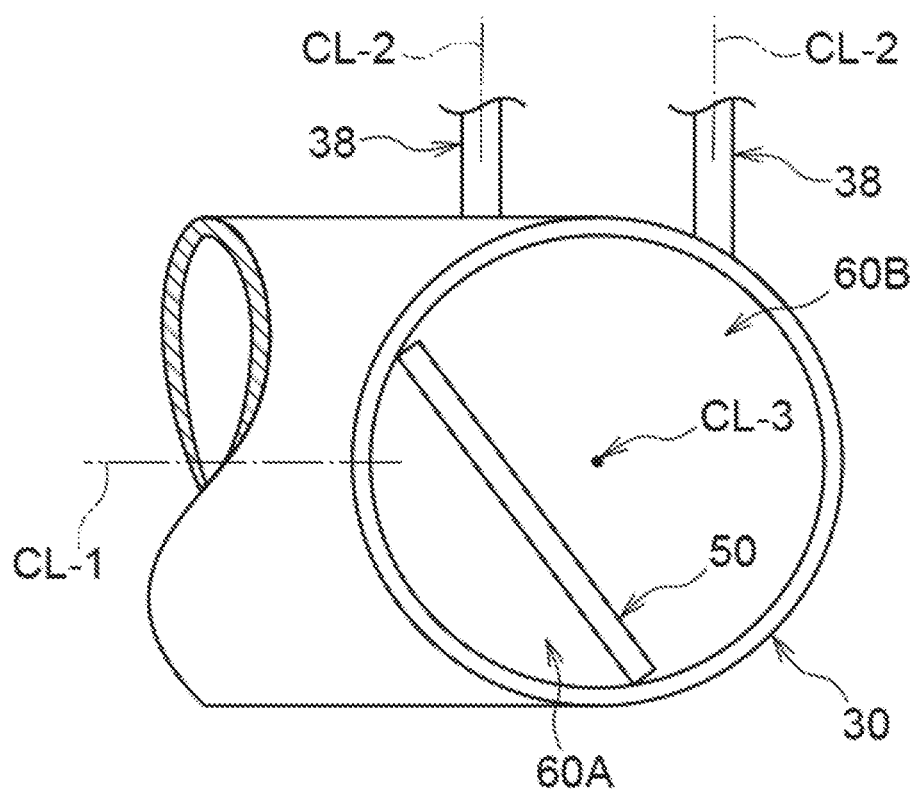
FIG. 7 is an exemplary plan view illustrating a manifold.

As illustrated in FIG. 5, the inflow port 32 and the plurality of outflow ports 34 are formed at positions facing each other when viewed in the axial direction of the distribution pipe 30, for example, in a direction of an arrow A1 illustrated in FIG. 4. For example, as illustrated in FIG. 7, the center line CL-1 of the inflow port 32 and the center line CL-2 of each of the plurality of outflow ports 34 may intersect at right angle or diagonally. If the inflow port 32 and the plurality of outflow ports 34 face each other, a portion perpendicularly intersecting the center line CL-1 of the inflow port 32, for example, the second facing portion 58 and a portion facing the center line CL-2 of each of the plurality of outflow ports 34, for example, the facing portion 56 may be easily generated by one partition plate 50.

The partition plate 50 continues from the upper base 30A of the one end to the lower base 30B of the other end inside the distribution pipe 30 in the axial direction. There is no gap between the partition plate 50 and, the upper base 30A and the lower base 30B. Therefore, it may not happen that the cooling liquid flows unintentionally from the first region 60A to the second region 60B through the gap.

As an example of the specific structure, the structure may be set such that the length L of the distribution pipe 30=1700 mm, the inner diameter b=42 mm, the inner diameter a of the inflow port 32=42 mm, the number n of the outflow ports 34=72, the inner diameter c=7 mm, the offset amount s of the partition plate 50=7 mm, the inner diameter d of the through-hole 52=4 mm, and the pitch p=5 mm. In the structure, for example, in a case where the cooling liquid is circulated at a flow rate of 120 liters/minute, variation in the flow rate at the outflow ports 34 is reduced and the flow rate may be uniform.

For example, in a structure in which a large number of the electronic components 20 are arranged side by side in high density along with performance improvement of the information processing apparatus 12, or the like, the number of the supply pipes 38 increases and the number of the outflow ports 34 of the distribution pipe 30 also increases. For example, even in the information processing apparatus including the distribution pipe 30 in which a large number of the outflow ports 34 are formed, since the flow rate of the cooling liquid flowing through the outflow ports 34, for example, the supply pipes 38 is uniform, a large number of the electronic components 20 may be efficiently cooled.

Figure 8:
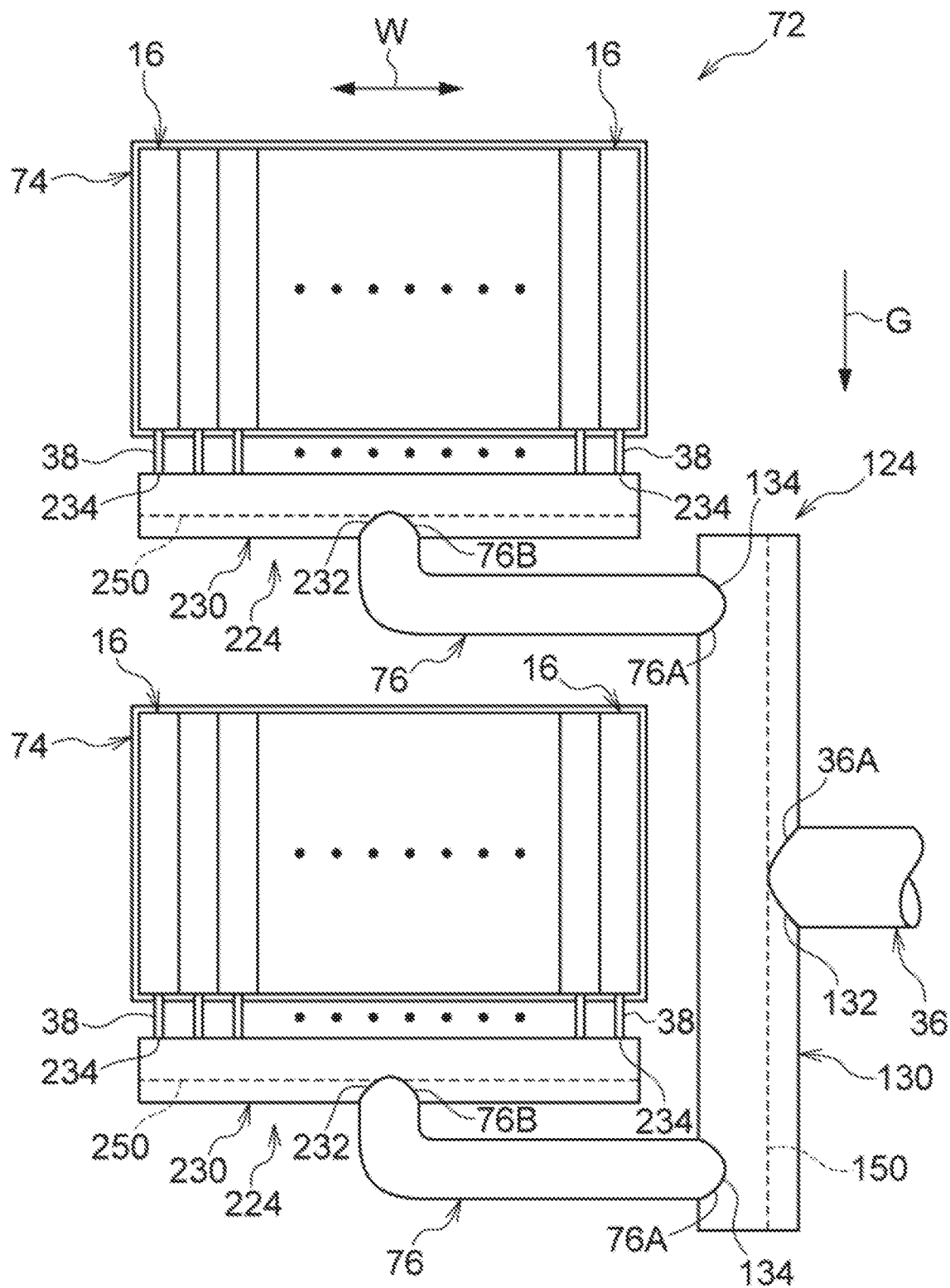
FIG. 8 is an exemplary front view of an information processing apparatus.

In FIG. 8, the same reference numerals are given to the same elements or members illustrated in FIGS. 1 to 7 and detailed description may be omitted.

As illustrated in FIG. 8, an information processing apparatus 72 has a plurality of racks 74. A plurality of server units 16 are accommodated in each of the racks 74 in a row in a width direction (arrow W direction) in a state of being vertically placed. In FIG. 8, two racks 74 are arranged vertically and three or more racks 74 may be arranged.

The information processing apparatus 72 has a first distribution pipe 130 and a second distribution pipe 230.

The first distribution pipe 130 is formed to have a first inflow port 132 and a plurality of first outflow ports 134, and a first partition plate 150 is disposed inside the first distribution pipe 130. The number of the first outflow ports 134 may be the same as that of the racks 74 or, for example, as illustrated in FIG. 7, may be two.

The first inflow port 132 is connected to one end 36A of a circulation pipe 36 and each of the first outflow ports 134 is connected to one end 76A of an intermediate pipe 76. An entire structure of the information processing apparatus 72 illustrated in FIG. 8 may be referred to that in FIG. 1.

For example, similar to the partition plate 50 illustrated in FIG. 6, the first partition plate 150 is formed to have a plurality of through-holes 52 of which a total opening area is greater than an opening area of the first inflow port 132 and each opening area is smaller than an opening area of each of the first outflow ports 134. The first partition plate 150 is formed to have a facing portion 56 facing the first outflow port 134 and a second facing portion 58 facing the first inflow port 132.

The second distribution pipe 230 is formed to have a second inflow port 232 and a plurality of second outflow ports 234, and a second partition plate 250 is disposed inside the second distribution pipe 230. The number of the second outflow ports 234 may be the same as the number of the server units 16 accommodated in one rack 74. The second inflow port 232 is connected to the other end 76B of the intermediate pipe 76 and each of the second outflow ports 234 is connected to one end of the supply pipe 38.

Similar to the partition plate 50 (see FIG. 6) of the first embodiment, the second partition plate 250 is formed to have the plurality of through-holes 52 of which the total opening area is greater than the opening area of the second inflow port 232 and each opening area is smaller than an opening area of each of the second outflow ports 234. The second partition plate 250 is formed to have the facing portion 56 facing the second outflow port 234 and the second facing portion 58 facing the second inflow port 232.

Also in FIG. 8, as illustrated in FIG. 1, a heat transfer member that transmits heat of the electronic component of the server unit 16 to the cooling liquid is provided. The cooling liquid, which is supplied from the supply pipe 38 to the heat transfer member and receives heat of the electronic component, is discharged from a discharge pipe 40 to a joining pipe 42. The cooling liquid joining in the joining pipe 42 flows to the other end 36B of the circulation pipe 36. Also in FIG. 8, a structure having a liquid circulation member 28 is provided and the circulation pipe 36 is provided with a tank 44, a pump 46, and the heat radiation member 48 as illustrated in FIG. 1.

In FIG. 8, the inside of the first distribution pipe 130 is partitioned by the first partition plate 150. A flow rate of the cooling liquid flowing out from the first outflow port 134 is uniform by the first partition plate 150. For example, a structure of the liquid flow dividing member 124, in which the first distribution pipe 130 may be an example of the branch pipe and the first partition plate 150 may be an example of the partition wall, is realized.

In FIG. 8, the inside of the second distribution pipe 230 is partitioned by the second partition plate 250. The flow rate of the cooling liquid flowing out from the second outflow port 234 is uniform by the second partition plate 250. For example, a structure of a liquid flow dividing member 224, in which the second distribution pipe 230 may be an example of the branch pipe and the second partition plate 250 may be an example of the partition wall, is realized.

Figure 9:
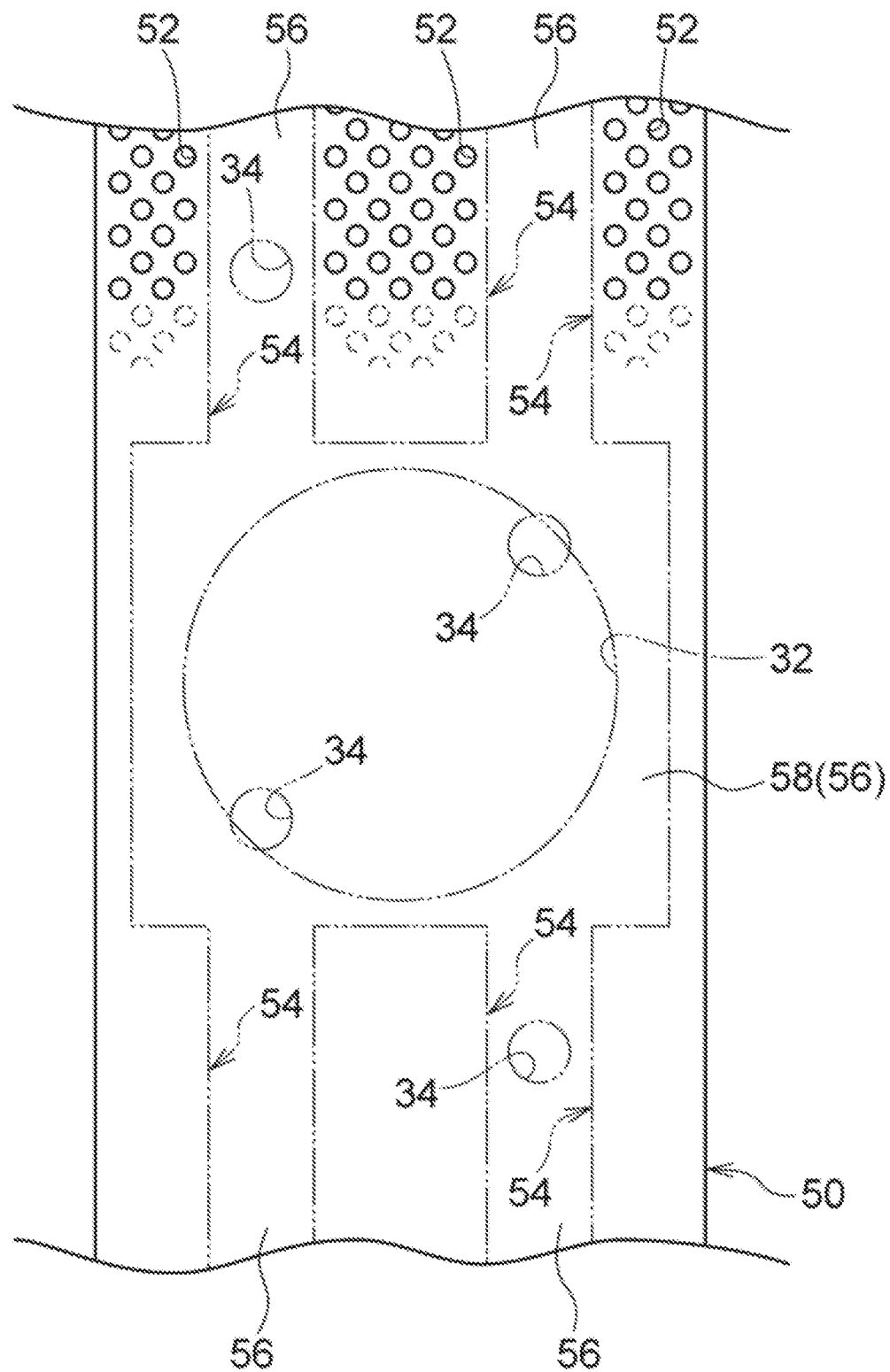
FIG. 9 is an exemplary front view of a partition wall.
Figure 10:
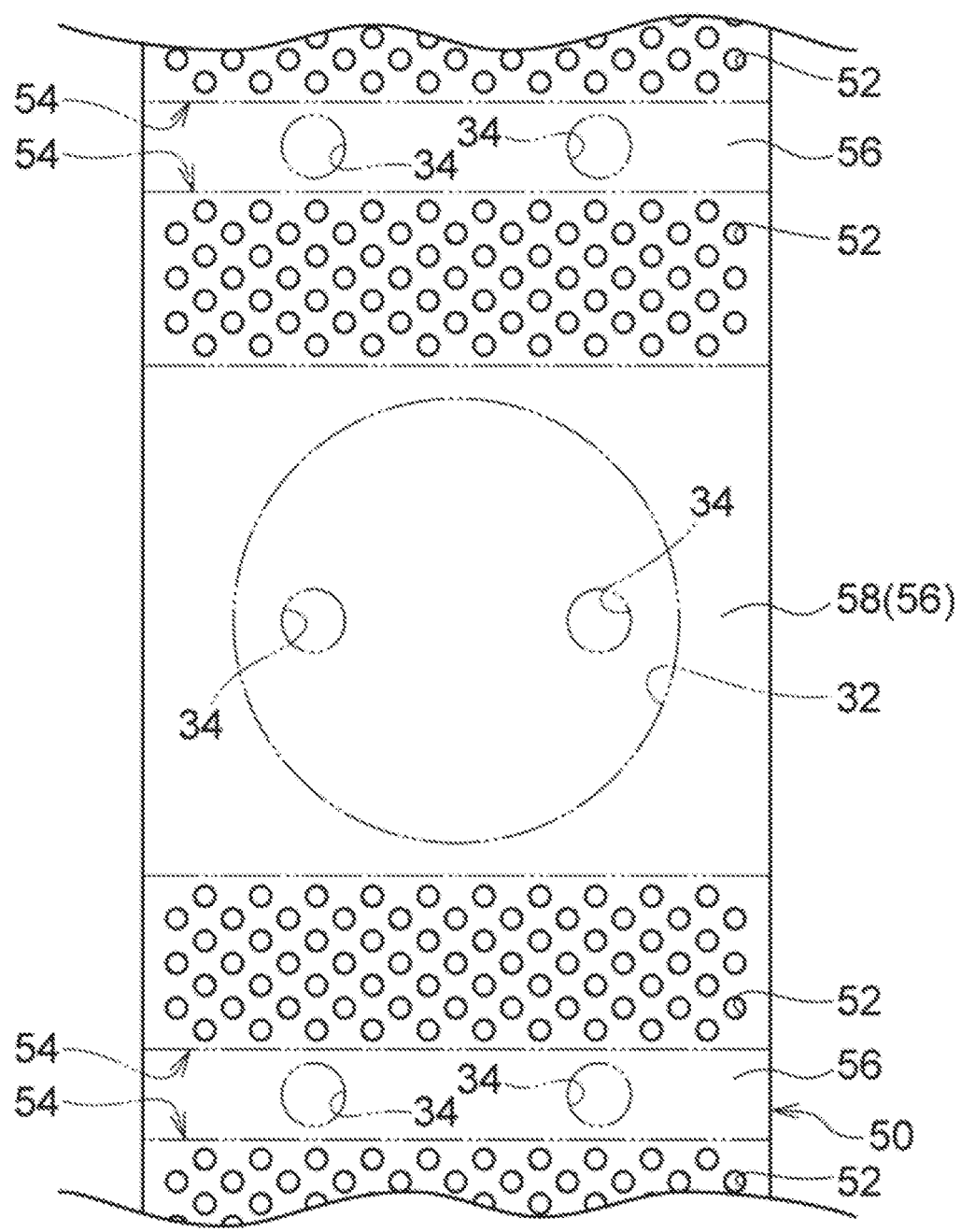
FIG. 10 is an exemplary front view illustrating a partition wall, an inflow port, and outflow ports.
Figure 11:
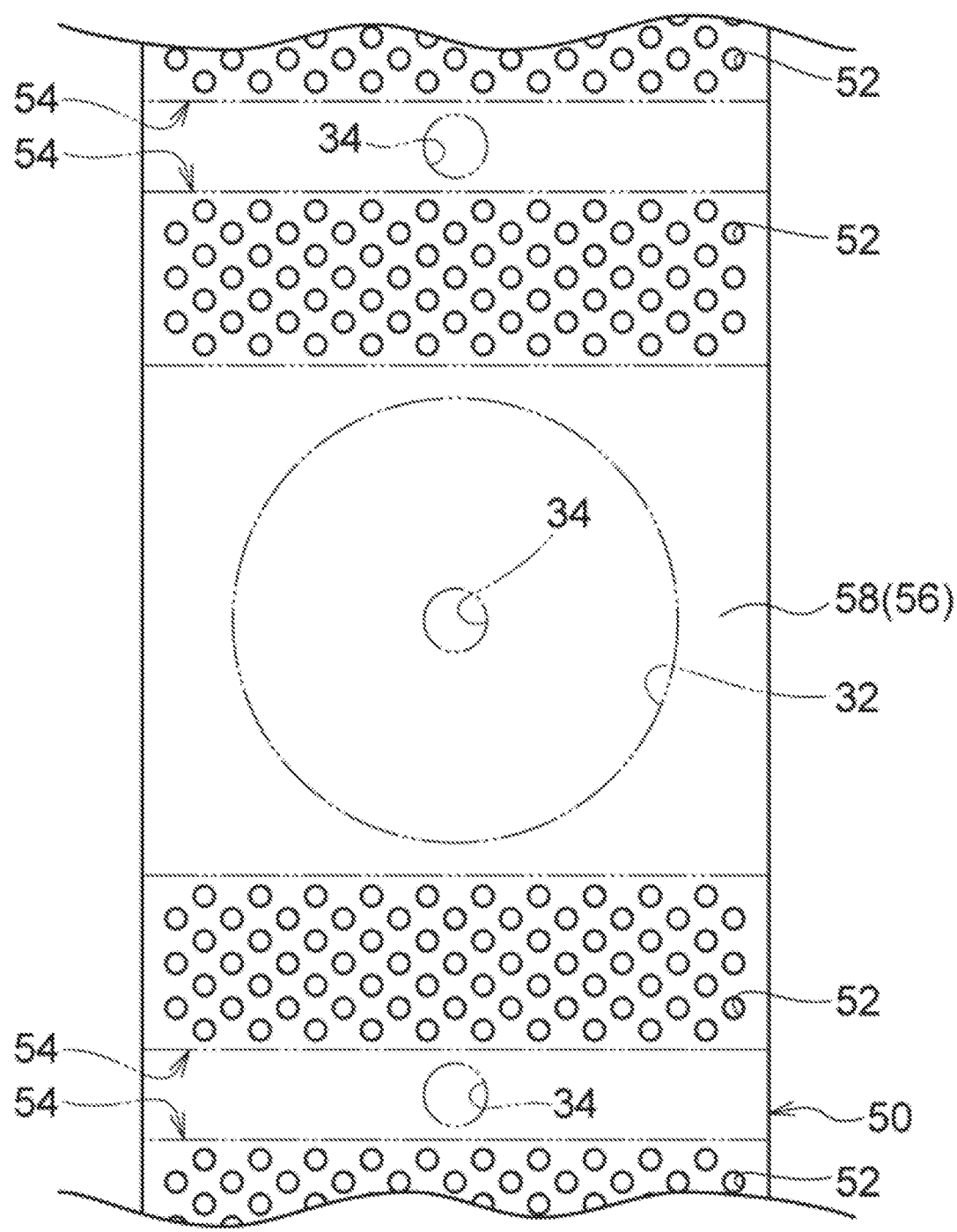
FIG. 11 is an exemplary front view illustrating a partition wall, an inflow port, and outflow ports.

The arrangement of the outflow ports 34 (including the first outflow port 134 and the second outflow port 234) or a shape of the partition plate 50 (including the first partition plate 150 and the second partition plate 250) may be, for example, a shape illustrated in FIGS. 9 to 11.

In FIG. 9, a height of the outflow port 34 is shifted vertically for each row and the outflow ports 34 are arranged in a so-called zigzag manner. Since the facing portion 56 of the partition plate 50 continues in a height direction, a degree of freedom of the position of the outflow port 34 in the height direction may be high.

In FIG. 10, a shape, in which the facing portion 56 and the through-hole forming portion 54 are alternately positioned, is provided in the height direction of the partition plate 50. Since the facing portion 56 continues in a width direction of the partition plate 50, for example, three or more through-holes 52 may be formed in the width direction of the partition plate 50.

In FIG. 11, a structure, in which the facing portion 56 and the through-hole forming portion 54 are alternately positioned in the height direction of the partition plate 50, and the through-holes 52 are formed in a row, is provided.

In the structure having the three or more outflow ports 34, the outflow ports 34 may be disposed at equal intervals, or may be disposed at unequal intervals in the axial direction and the circumferential direction of the distribution pipe 30.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manifold comprising:
   a branch pipe including an inflow port and a plurality of outflow ports; and
   a partition wall that partitions an inside of the branch pipe into a side of the inflow port and a side of the plurality of outflow ports and includes:
      a first facing portion provided at the inflow port and configured to face a part of the plurality of outflow ports;
      a second facing portion configured to extend from the first facing portion in a longitudinal direction of the partition wall, face another part of the plurality of outflow ports and has a narrower width than a width of the first facing portion; and
      a plurality of through-holes provided at both sides of the second facing portion and configured to extend along the second facing portion,
   an opening area of each of the plurality of through-holes is smaller than an opening area of each of the outflow ports.

2. The manifold according to claim 1, wherein the partition wall is disposed at a position intermediate between the inflow port and the outflow ports or a position closer to the inflow port than the outflow ports.

3. The manifold according to claim 1, wherein the second facing portion perpendicularly intersects a center line of the outflow ports.

4. The manifold according to claim 1, wherein the plurality of through-holes have a total opening area greater than an opening area of the inflow port.

5. The manifold according to claim 1, wherein the first facing portion perpendicularly intersects a center line of the inflow port.

6. The manifold according to claim 1, wherein the branch pipe is formed in a cylindrical shape, and wherein the inflow port and the plurality of outflow ports are disposed on an outer peripheral surface of the branch pipe.

7. The manifold according to claim 6, wherein the partition wall includes another second facing portion configured to extend in the longitudinal direction of the partition wall in parallel with the second facing portion.

8. The manifold according to claim 6, wherein the partition wall continues from a bottom surface of one end of the branch pipe to a bottom surface of the other end of the branch pipe in the axial direction.

9. An information processing apparatus comprising:
   a manifold including:
      a branch pipe with an inflow port and a plurality of outflow ports; and
      a partition wall that partitions an inside of the branch pipe into a side of the inflow port and a side of the plurality of outflow ports and includes:
         a first facing portion provided at the inflow port and configured to face a part of the plurality of outflow ports;
         a second facing portion configured to extend from the first facing portion in a longitudinal direction of the partition wall, face another part of the plurality of outflow ports and has a narrower width than a width of the first facing portion; and
         a plurality of through-holes provided at both sides of the second facing portion and configured to extend along the second facing portion;
   a circulation member that circulates a cooling liquid by combining the cooling liquid flowing out from the plurality of outflow ports and sending the combined cooling liquid to the inflow port; and
   a plurality of electronic components that are cooled by the cooling liquid flowing out from the plurality of outflow ports,
   an opening area of each of the plurality of through-holes is smaller than an opening area of each of the outflow ports.

10. The information processing apparatus according to claim 9, wherein the partition wall is disposed at a position intermediate between the inflow port and the outflow ports or a position closer to the inflow port than the outflow ports.

11. The information processing apparatus according to claim 9, wherein the second facing portion perpendicularly intersects a center line of the outflow ports.

12. The information processing apparatus according to claim 9, wherein the plurality of through-holes have a total opening area greater than an opening area of the inflow port.

13. The information processing apparatus according to claim 9, wherein the first facing portion perpendicularly intersects a center line of the inflow port.

14. The information processing apparatus according to claim 9, wherein the branch pipe is formed in a cylindrical shape, and wherein the inflow port and the plurality of outflow ports are disposed on an outer peripheral surface of the branch pipe.

15. The information processing apparatus according to claim 14, wherein the partition wall includes another second facing portion configured to extend in the longitudinal direction of the partition wall in parallel with the second facing portion.

16. The information processing apparatus according to claim 14, wherein the partition wall continues from a bottom surface of one end of the branch pipe to a bottom surface of the other end of the branch pipe in the axial direction.

* * * * *